US007358731B2

(12) United States Patent
Fuderer et al.

(10) Patent No.: US 7,358,731 B2
(45) Date of Patent: Apr. 15, 2008

(54) DETERMINATION OF SPATIAL SENSITIVITY PROFILES OF RF COILS IN MAGNETIC RESONANCE IMAGING

(75) Inventors: Miha Fuderer, Eindhoven (NL); Robert Paul Kleihorst, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/569,193

(22) PCT Filed: Aug. 9, 2004

(86) PCT No.: PCT/IB2004/051422

§ 371 (c)(1),
(2), (4) Date: Feb. 22, 2006

(87) PCT Pub. No.: WO2005/022184

PCT Pub. Date: Mar. 10, 2005

(65) Prior Publication Data

US 2006/0261809 A1 Nov. 23, 2006

(30) Foreign Application Priority Data

Aug. 27, 2003 (EP) .................. 03103228

(51) Int. Cl.
*G01V 3/00* (2006.01)

(52) U.S. Cl. ................ 324/309; 324/307; 324/318
(58) Field of Classification Search ................ 324/306, 324/307, 309, 318; 600/410, 422

See application file for complete search history.

(56) References Cited

U.S. PATENT DOCUMENTS 4,983,921 A 1/1991 Kramer et al. .............. 324/309

(Continued)

OTHER PUBLICATIONS

Lin, F., et al.; Removing Signal Intensity Inhomogeneity from Surface Coil MRI Using Discrete Wavelet Transform and Wavelet Packet; 2001; http://surflets.mit.edu/-yrchen/Research.

(Continued)

*Primary Examiner*—Brij Shrivastav
*Assistant Examiner*—Tiffany A. Fetzner

(57) ABSTRACT

The invention relates to a method for determination of spatial sensitivity profiles of RF transmit and/or receive coils (7, 8, 9) in an examination volume (17) of a magnetic resonance (MR) imaging device (1). In accordance with the method of the invention, nuclear magnetization is excited within the examination volume (17) by a sequence of RF pulses and switched magnetic field gradients, wherein the sequence comprises RF pulses with at least two different excitation flip angles. MR signals are acquired and processed so as to form at least two MR images, each corresponding to one of these flip angles. The spatial sensitivity profiles are then computed in the positions of the pixels or voxels of the MR images based upon the dependence of the pixel or voxel values on the respective flip angles. Alternatively, a plurality of instances of a sequence of RF pulses and switched magnetic field gradients is applied and MR signals are acquired, wherein a different combination of transmit and receive coils (7, 8, 9) is used for each instance of the sequence. The spatial sensitivity profiles are then computed in the positions of the pixels or voxels of the MR images formed from the acquired MR signals by taking the logarithm of the pixel or voxel values and by solving a linear system of equations for each pixel or voxel.

17 Claims, 2 Drawing Sheets

U.S. PATENT DOCUMENTS

| | | | | |
|---|---|---|---|---|
| 5,086,275 | A * | 2/1992 | Roemer | 324/309 |
| 5,185,573 | A * | 2/1993 | Larson, III | 324/309 |
| 5,221,900 | A * | 6/1993 | Larson, III | 324/307 |
| 5,252,922 | A * | 10/1993 | Larson, III | 324/309 |
| 5,600,244 | A | 2/1997 | Jensen et al. | 324/309 |
| 5,864,234 | A | 1/1999 | Ludeke | 324/309 |
| 5,943,433 | A | 8/1999 | Avinash | 382/131 |
| 6,307,368 | B1 * | 10/2001 | Vasanawala et al. | 324/309 |
| 6,477,398 | B1 * | 11/2002 | Mills | 600/409 |
| 6,650,925 | B2 * | 11/2003 | Wang | 324/309 |
| 2002/0039024 | A1 | 4/2002 | Fuderer et al. | 324/307 |
| 2002/0074999 | A1 | 6/2002 | Katscher et al. | 324/307 |
| 2002/0111549 | A1 * | 8/2002 | Wang | 600/407 |
| 2002/0171422 | A1 | 11/2002 | King | 324/307 |
| 2004/0189297 | A1 * | 9/2004 | Bock et al. | 324/307 |
| 2006/0261809 | A1 * | 11/2006 | Fuderer et al. | 324/309 |

OTHER PUBLICATIONS

Mihara, H., et al.; A method of RF inhomogeneity correction in MR imaging; 1998; Magnetic Resonance Materials in Physics, Biology and Medicine; 7:115-120.

Oghabian, M.A., et al.; Measurement of RF non-homogeneity in MRI, using spin echo protocols; Sep. 2005; Proc. Int'l Conf. Visual., Imag., Imag. Proc.; pp. 377-381.

* cited by examiner

DETERMINATION OF SPATIAL SENSITIVITY PROFILES OF RF COILS IN MAGNETIC RESONANCE IMAGING

The invention relates to a method for determination of spatial sensitivity profiles of RF transmit and/or receive coils in an examination volume of a magnetic resonance imaging device.

Furthermore, the invention relates to a magnetic resonance imaging device for carrying out this method and a computer program for a magnetic resonance imaging device.

Magnetic resonance (MR) imaging techniques always employ a spatially uniform and temporally constant main magnetic field usually referred to as $B_0$. For the purpose of excitation of nuclear spin magnetization within the examination volume of the magnetic resonance imaging device, a $B_1$ radio frequency (RF) field is superimposed on the $B_0$ field at the respective proton resonant frequency. MR devices further comprise a set of gradient coils for the generation of linear gradient magnetic fields by which a spatial encoding of the nuclear spin magnetization is achieved. During the actual MR imaging procedure, pulse sequences consisting of RF and switched magnetic field gradients are applied to an object (a patient) to generate MR signals which are scanned in order to obtain information therefrom and to reconstruct images of the object. The properties of the applied pulse sequence determines completely the characteristics of the reconstructed images, such as location and orientation in the object, dimensions, resolution, signal-to-noise ratio, contrast, sensitivity for movements, etcetera.

In MR imaging, the images formed from the acquired signals are often corrupted by non-uniformities in spatial intensity. Such non-uniformities, which impair both the visualization as well as the analysis of the images, are mainly caused by non-uniform spatial sensitivity profiles of RF coils used for radiating RF pulses towards the examined object and for receiving MR signals from the examination volume of the MR apparatus. The spatial sensitivity profile of an RF transmit coil is determined by the location-dependence of the strength of the RF magnetic field $B_1$ acting on the examination volume during the irradiation of RF pulses. The spatial sensitivity of a receive coil in turn is determined by the dependence of the amplitude of the detected MR signals on the location within the examination volume where the corresponding nuclear spin magnetization occurs. Since in many cases the sensitivities of MR transmit and receive coils are spatially inhomogeneous, the images formed by means of such RF coil arrangements have to be corrected so as to eliminate the location-dependent sensitivity differences.

The correction of non-uniformities in MR images caused by non-uniform sensitivity profiles of the employed RF coils can be performed as it is for example known from U.S. Pat. No. 5,600,244. This document relates to MR image acquisition by means of a surface coil arrangement exhibiting a locally inhomogeneous sensitivity. The acquired images are corrected in accordance with this known method on the basis of so-called auxiliary or calibration values derived from MR signal data acquired by means of a body coil arrangement having a locally at least approximately homogeneous sensitivity. In addition to the actual MR examination, an MR auxiliary or calibration measurement is performed by means of the surface coil arrangement as well as by means of the body coil arrangement. MR images are acquired and reconstructed for the body coil and for the surface coils during temporally succeeding steps. The spatial sensitivity profiles of the surface coils are then derived from the ratios of pixel or voxel values obtained with the body coil to the corresponding values obtained with the surface coils.

A main drawback of this known method is that an additional MR (body) coil with a homogeneous sensitivity profile is required. With so-called high-field MR scanners, i.e. MR imaging devices comprising main magnets for establishing $B_0$ fields of 3 Tesla or more, the problem arises, that RF transmit or receive coils with a homogeneous spatial sensitivity profile do not exist at all. This is due to the short wavelength of the resonant RF fields in the human body at such high main magnetic fields and to tissue-dependent dielectric and conductivity-related properties of the body of the examined patient. Thus, a complex spatial sensitivity behavior caused by the individual properties of the patient has to be expected at high $B_0$ fields. Furthermore, it has to be taken into account that, particularly at high $B_0$ fields, the spatial sensitivity profile of a single RF coil in transmit mode can differ from the spatial sensitivity profile of the same coil in receive mode.

It is therefore readily appreciated that there is a need for an improved method for determination of spatial sensitivity profiles of RF transmit and/or receive coils in MR imaging. It is consequently the primary objective of the present invention to provide such a method in which it is avoided that a calibration against an additional coil with a substantially homogeneous sensitivity profile has to be performed.

In accordance with the present invention, this object is achieved by a method of the type specified above comprising the following steps:

a) excitation of nuclear magnetization within the examination volume of the magnetic resonance imaging device by a sequence of RF pulses and switched magnetic field gradients, wherein the sequence comprises RF pulses with at least two different excitation flip angles;

b) acquiring MR signals from the examination volume;

c) processing the acquired MR signals so as to form at least two MR images, each corresponding to one of the excitation flip angles;

d) computing the spatial sensitivity profiles of the RF transmit or receive coils in the positions of the pixels or voxels of the MR images based upon the dependence of the pixel or voxel values on the respective excitation flip angles.

In accordance with the method of the invention, a series of two or more MR images is formed, wherein each of the images is assigned to one particular excitation flip angle of the applied imaging sequence. The spatial sensitivity profiles of the employed RF transmit and/or receive coils can then be calculated from the pixel or voxel values of these (two-dimensional or three-dimensional) images. The main advantage of the method of the invention is that no additional RF coil with a homogeneous sensitivity profile is required for calibration. This makes the method of the invention applicable to high-field MR imaging at a main magnetic field strength of 3 Tesla or more. However, it is likewise advantageous at a lower "standard" field strength of for example 1.5 Tesla.

The invention is based on the finding that there is a physically well-defined influence of the excitation flip angle on the pixel or voxel values of the MR images. The inversion of the relation between the excitation flip angle and the image values in the positions of the pixels or voxels of the MR images advantageously enables to compute both transmit and receive sensitivities of the respective RF coils without the need of a homogeneous RF coil as a reference.

The method of the invention can advantageously be carried out by systematically varying the excitation flip angles around 90° during excitation of nuclear magnetization in step a), wherein the spatial sensitivity profiles are then estimated by finding flip angle values resulting in maximum pixel or voxel values. This proceeding is based upon the knowledge that a maximum MR signal is obtained when the vector of the nuclear magnetization is effectively flipped by an angle of 90° from the longitudinal into the transverse direction. Hence, the spatial sensitivity of the respective RF coil can be estimated by comparing the nominal values of the different excitation flip angles applied during acquisition of a series of MR signal data sets with a value of 90° for those pixels or voxels of the formed images which show a maximum intensity.

The sequence of RF pulses and switched magnetic field gradients applied in accordance with the invention can usefully be a gradient echo sequence comprising an interleaving succession of RF excitation pulses with two or more different excitation flip angles. This advantageously allows for a simultaneous and thus fast acquisition of a plurality of MR signal data sets, wherein each of the data sets is assigned to a different excitation flip angle. The applied imaging sequence can for example be a so-called FFE (fast field echo) sequence. Then, after image formation, the spatial sensitivity profiles of the employed RF transmit and/or receive coils can be derived from the ratios of pixel or voxel values corresponding to the respective flip angles.

With the method of the invention it is useful that the spatial sensitivity profiles of the receive coils can be estimated, once the spatial sensitivity profiles of the transmit coils are known. It thus makes sense to firstly determine the sensitivity profiles of the transmit coils in the above-described way, and then estimate the spatial sensitivity of the receive coils. The estimation of the receive sensitivities can be based upon a-priori knowledge, such as, for example, that the spatial sensitivity profiles of the receive coils are continuous, slowly-varying functions of the space coordinates and that the pixel or voxel values of the MR images have to be smaller than the corresponding values of pure water. It is furthermore known a-priori that, in usual cases, the transmit sensitivity does not deviate very much from the receive sensitivity of the same RF coil. The spatial sensitivity profiles of the receive coils can for example be estimated in accordance with the method as described in U.S. Pat. No. 5,864,234. In accordance with the present invention, the above-mentioned objective is alternatively achieved by a method comprising the following steps:

a) excitation of nuclear magnetization within the examination volume by a plurality of instances of a sequence of RF pulses and switched magnetic field gradients, and acquiring MR signals from the examination volume, wherein a different combination of transmit and/or receive coils are used for each instance of the sequence of RF pulses and switched magnetic field gradients;

b) processing the MR signals so as to form MR images for each combination of transmit and/or receive coils;

c) computing the spatial sensitivity profiles in the positions of the pixels or voxels of the MR images by taking the logarithm of the pixel or voxel values and by solving a linear system of equations for each pixel or voxel.

According to this method, a series of at least three MR images is formed, wherein each of the images is assigned to one particular combination of transmit and receive coils. Each of the pixel or voxel values of the MR images formed from the acquired signal data depends on three factors, namely the transmit sensitivity, the receive sensitivity and the proton density in the positions of the respective pixels or voxels. Linear systems of equations comprising these three factors as unknown variables are generated by taking the logarithm of the pixel or voxel values for each location in the examination volume. These systems of equations can then easily be solved by known linear algebraic algorithms, provided that three or more transmit and receive coils are employed.

RF pulses with small excitation flip angles should be used in accordance with this method of the invention, in order to establish a linear relationship between the pixel or voxel values of the MR images and the respective sensitivities of the RF coils.

The advantage of this alternative method of the invention is again that no additional RF coil with a homogeneous sensitivity profile is required for calibration. This makes the method applicable to high-field MR imaging.

It turns out that the above-described methods of the invention are particularly useful for correcting MR images so as to eliminate any location-dependent sensitivity differences therefrom. But they can also be applied to determine the spatial sensitivity profiles of RF coils employed in parallel MR imaging, such as for example in the known so-called transmit and/or receive SENSE (sensitivity encoding) imaging techniques.

Each of the above-described methods can advantageously be applied as a pre-scan for determination of spatial sensitivity profiles of RF transmit and/or receive coils in an examination volume of a MR imaging device, wherein the pre-scan is followed by a diagnostic scan, during which diagnostic MR signals are acquired and processed using said sensitivity profiles. In order to keep the measuring time required for determining the required sensitivity profiles as short as possible, the resolution of the MR images formed during the pre-scan should be coarse as compared to MR images formed during diagnostic scanning. The coarse resolution is usually sufficient to investigate the slowly-varying spatial behavior of the sensitivity profiles of the RF coils.

It is easily possible to incorporate the methods of the present invention in a dedicated device for MR imaging of an object (a patient) placed in a stationary and substantially homogeneous main magnetic field. Such an MR scanner comprises a preferably cryogenic main magnetic coil for establishing the main magnetic field, gradient coils for generating magnetic field gradients superimposed upon the main magnetic field, at least one RF coil for radiating RF pulses towards the object and/or for receiving MR signals generated by sequences of RF pulses and switched magnetic field gradients, a control unit for controlling the generation of magnetic field gradients and RF pulses, and a processing unit for forming MR images from the received MR signals. The control unit as well as the processing unit, which are usually microcomputers with a memory and a program control, comprise a programming with a description of a procedure according to the above-described methods of the invention. The (random access) memory of the processing unit can advantageously be used to store the spatial sensitivity profiles of the RF coils computed in accordance with the method of the invention. If the method of the invention is applied as a pre-scan for determination of the spatial sensitivity profiles, the sensitivity profiles stored in the memory of the processing unit can then directly be accessed for processing the MR signals acquired during subsequent diagnostic scanning. The control unit and the processing unit can be one single microcomputer or be separate.

A computer program adapted for carrying out the methods of the invention can advantageously be implemented on any common computer hardware, which is presently in clinical use for the control of MR scanners. The computer program can be provided on suitable data carriers, such as CD-ROM or diskette. Alternatively, it can also be downloaded by a user from an internet server.

Preferred embodiments of the invention are disclosed in the following with reference to the drawings. It should be understood, however, that the drawings are designed for the purpose of illustration only and not as a definition of the limits of the invention.

In the drawings

Figure 1:
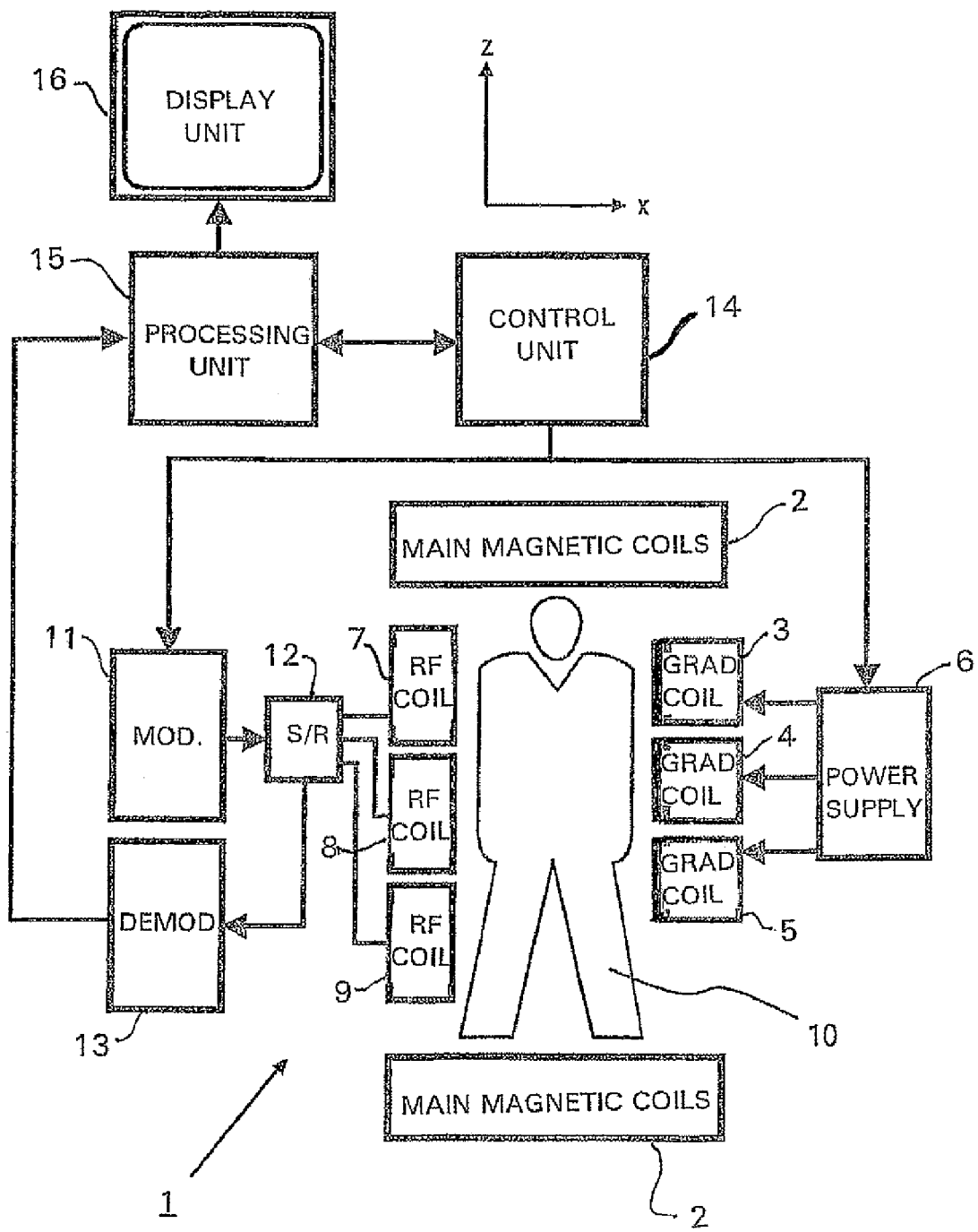
FIG. 1 shows an embodiment of an MR scanner of the invention.

A MR imaging device 1 is diagrammatically shown in FIG. 1. The apparatus 1 comprises a set of main magnetic coils 2 for generating a stationary and homogeneous main magnetic field of 3 Tesla or more. Provision is made for three sets of gradient coils 3, 4, and 5 for superimposing additional magnetic fields with controllable strength and having a gradient in a selected direction. Conventionally, the direction of the main magnetic field is labelled the z-direction, the two directions perpendicular thereto the x- and y-directions. The gradient coils 3, 4, and 5 are energized via a power supply 6. The apparatus 1 further comprises three RF coils 7, 8, and 9 for transmitting RF pulses to a body 10, the RF coils 7, 8, and 9 being coupled to a modulator 11 for generating and modulating the RF pulses. The RF coils 7, 8, and 9 also serve for receiving MR signals emitted from the body 10. Since the RF coils are used both for transmitting and receiving, a send-receive switch 12 is arranged to separate the received MR signals from the RF pulses to be transmitted. The received MR signals are input to a demodulator 13. The modulator 11, the RF coils 7, 8, 9, and the power supply 6 for the gradient coils 3, 4, and 5 are controlled by a control unit 14 to generate sequences of RF pulses and corresponding sequences of switched magnetic field gradients. The control unit 14 is usually a microcomputer with a memory and a program control. The demodulator 13 is coupled to a processing unit 15, again a microcomputer, for transformation of the received MR signals into images that can be made visible, for example on a visual display unit 16. For the practical implementation of the invention, both the control unit 14 and the processing unit 15 comprise programmings with a description of a procedure according to the above-described methods. The RAM memory of the processing unit 15 is used to store the spatial sensitivity profiles of the RF coils 7, 8, and 9 computed in accordance with the method of the invention. In this way, the stored sensitivity profiles are then accessible for processing MR signals acquired for the purpose of diagnostic imaging.

Figure 2:
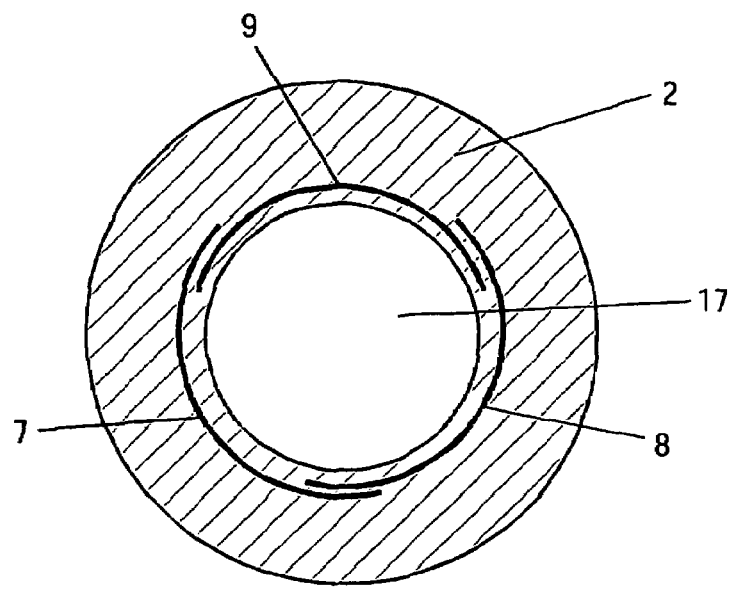
FIG. 2 shows a system of three RF coils used in accordance with the invention.

A cross-sectional view through the main magnet 2 of the MR device 1 is shown in FIG. 2. The three RF coils 7, 8, and 9 are arranged around the central bore of the main magnet 2. This central bore forms an examination volume 17 of the magnetic resonance device 1. Because of their shape and their different positions and orientations in relation to the examination volume 17, the three RF coils 7, 8, and 9 have nonuniform and different spatial sensitivity profiles.

In accordance with the invention, the transmit and receive sensitivities of the RF coils 7, 8, and 9 can be determined as follows:

The transmit sensitivity of each of the RF coils 7, 8, and 9 can be defined as the normalized positively rotating magnetic component of the RF field generated by the respective coil. It is assumed that the transmit sensitivity $S_T(\vec{x})$ is a complex function of space vector $\vec{x}$ and that is equal to 1 in the case of a perfectly uniform transmit sensitivity of the respective coil. If in accordance with the invention sequences of RF pulses with nominal excitation flip angles $\alpha_0$, $\beta_0$, or $\gamma_0$ are applied, the magnetization vector at position $\vec{x}$ "senses" an effective flip angle of $\alpha_0 S_T(\vec{x})$, $\beta_0 S_T(\vec{x})$, or $\gamma_0 S_T(\vec{x})$, respectively. $S_T(\vec{x})$ will deviate significantly from 1 for RF coils exhibiting non-uniform transmit sensitivities and its phase will be different from zero in most practical cases.

As described above, the nominal excitation flip angles of the applied imaging sequence can be varied around 90° for determination of transmit sensitivity. In this way, a series of MR images corresponding to excitation flip angles of for example 40°, 50°, . . . , 170°, 180° is formed. Since it is known that a maximum MR signal is obtained when the vector of the nuclear magnetization is flipped by a "sensed" angle of 90°, the spatial sensitivity of the respective RF coil can be estimated by comparing the nominal value $\alpha_0$ of the series of excitation flip angles with the value of 90° for those pixels or voxels of the corresponding series of images which show a maximum intensity. The modulus of the transmit sensitivity can then be calculated as $|S_T(\vec{x})|=90°/\alpha_{0,max}(\vec{x})$.

Figure 3:
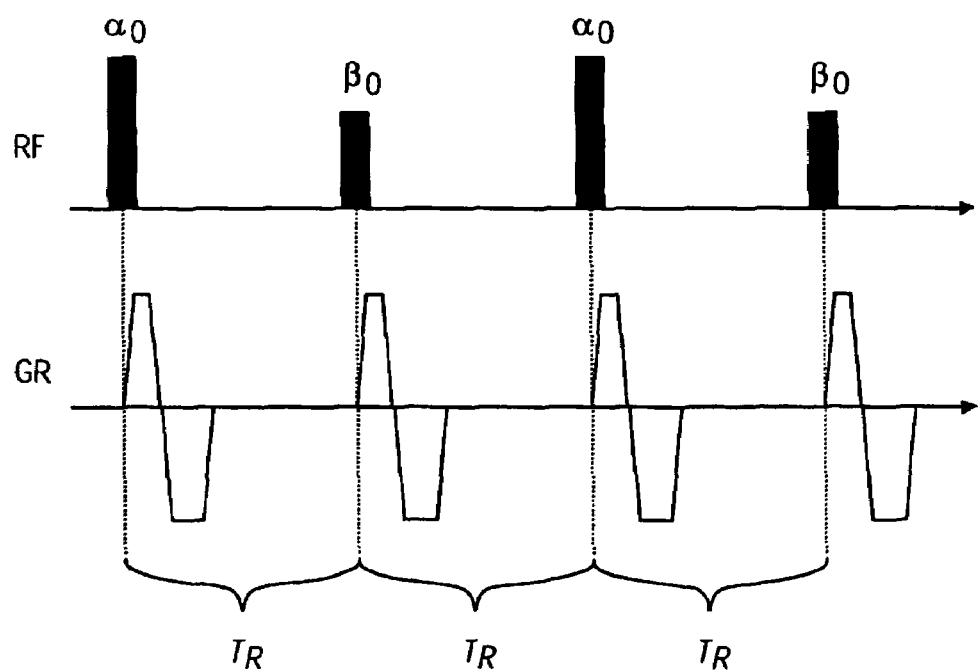
FIG. 3 shows an imaging sequence in accordance with the invention.

With the method of the invention it is alternatively possible to use a gradient echo sequence comprising an interleaving succession of RF excitation pulses with for example two different excitation flip angles $\alpha_0$ and $\beta_0$, as shown in FIG. 3. In the figure, the sequence of excitation pulses is designated by RF, while the succession of switched magnetic field gradients is designated by GR. By means of the depicted sequence, the transmit sensitivity can be derived from the ratios of pixel or voxel values corresponding to the respective flip angles as follows:

For a ($T_1$-weighted) fast field echo (FFE) sequence with alternate nominal excitation flip angles $\alpha_0$ and $\beta_0$, both being larger than the Ernst angle, and with a very short repetition time $T_R$, two images of the proton density $\rho(\vec{x})$ can be formed, namely $$M_A(\vec{x}) = \rho(\vec{x})\sin(\alpha_0 S_T(\vec{x})) \cdot \frac{1+\cos(\beta_0 S_T(\vec{x}))}{1-\cos(\beta_0 S_T(\vec{x}))\cos(\alpha_0 S_T(\vec{x}))} \cdot \frac{T_R}{T_1}$$

and $$M_B(\vec{x}) = \rho(\vec{x})\sin(\beta_0 S_T(\vec{x})) \cdot \frac{1+\cos(\alpha_0 S_T(\vec{x}))}{1-\cos(\alpha_0 S_T(\vec{x}))\cos(\beta_0 S_T(\vec{x}))} \cdot \frac{T_R}{T_1}.$$

The ratio of the pixel or voxel values of these two images is $$\frac{M_A(\vec{x})}{M_B(\vec{x})} = \frac{\sin(\alpha_0 S_T(\vec{x}))(1+\cos(\beta_0 S_T(\vec{x})))}{\sin(\beta_0 S_T(\vec{x}))(1+\cos(\alpha_0 S_T(\vec{x})))} = f(S_T(\vec{x})).$$

The right-hand side of this equation can be numerically inverted in order to compute $S_T(\vec{x})=f^{-1}(M_A(\vec{x})/M_B(\vec{x}))$.

In accordance with a different approach proposed by the invention, both the location-dependent transmit sensitivities $S_{T,i}(\vec{x})$ and the receive sensitivities $S_{R,j}(\vec{x})$ of a set of N RF transmit coils and M RF receive coils (i=1 . . . N, j=1 . . . M) can be determined by forming a series of images $M_{i,j}(\vec{x})$, wherein each combination of transmit and receive coils is used. If the flip angles of the employed RF pulses are small enough, the pixel or voxel values of the resulting images can be written as $M_{ij}(\vec{x})=\rho(\vec{x})S_{T,i}(\vec{x})S_{R,j}(\vec{x})$. This represents a system of (1+N+M)×(MN) equations for each position $\vec{x}$ within the examination volume. A linear system of equations, which can be solved for MN≧1+M+N by standard algorithms, is generated by taking the logarithm of the above equations.

This invention has been described with reference to the preferred embodiments. Modifications and alterations may occur to others upon reading and understanding the preceding detailed description. It is intended that the invention be constructed as including all such modifications and alterations insofar as they come wihtin the scope of the invention claims of the equivalents thereof.

The invention claimed is:

1. A method of magnetic resonance imaging comprising:
   (a) applying a prescan sequence including:
   (a1) excitation of nuclear magnetic resonance within an examination volume by a sequence of RF pulses and switched magnetic field gradients, the sequence including RF pulses with at least two different excitation flip angles;
   (a2) acquiring magnetic resonance signals from said examination volume;
   (a3) processing said magnetic resonance signals so as to form at least two magnetic resonance images each of the at least two magnetic resonance images corresponding to one of said at least two different excitation flip angles;
   (a4) computing spatial sensitivity profiles for pixels or voxels of said magnetic resonance images based upon a dependence of values of the pixels or voxels on their respective excitation flip angles;
   (b) subsequent to step (a), applying an additional diagnostic scan sequence that is independent and separate from the prescan sequence of step (a) to generate additional diagnostic magnetic resonance signals;
   (c) processing the additional diagnostic resonance signals using the computed sensitivity profiles into diagnostic images; wherein a resolution of the magnetic resonance images formed during said prescan sequence is coarse as compared to diagnostic images formed during said additional diagnostic scan sequence which follows the prescan sequence.

2. The method according to claim 1, wherein said excitation flip angles are varied around 90° C. in the prescan sequence during excitation of nuclear magnetic resonance in step a1) and wherein said spatial sensitivity profiles are estimated by finding flip angle values resulting in maximum pixel or voxel values.

3. The method according to claim 1, wherein in the prescan sequence said sequence of RF pulses and switched magnetic field gradients is a gradient echo sequence comprising an interleaving succession of RF excitation pulses with the at least two different excitation flip angles.

4. The method according to claim 1, wherein said spatial sensitivity profiles are derived from ratios of the pixel or voxel values corresponding to the respective flip angles.

5. The method according to claim 1, further including displaying the diagnostic image.

6. The method according to claim 1, wherein RF pulses with small excitation flip angles are used in the prescan sequence in step a1).

7. A computer-readable medium with a program code which controls a computer processor to perform the method of claim 1 on a magnetic resonance imaging device.

8. The method according to claim 1, wherein in the prescan sequence, RF pulses with at least three different flip angles are used to excite magnetic resonance and at least three images are formed from the acquired magnetic resonance signals.

9. The method according to claim 8, wherein sensitivity profiles of a set of at least three RF transmit and/or receive coils is determined.

10. The method according to claim 9, wherein computing the sensitivity profiles includes taking the logarithm of corresponding pixel or voxel values of the at least three prescan images and by solving a linear system of equations for the pixel or voxel values.

11. The method according to claim 9, wherein spatial sensitivity profiles of said receive coils are estimated based upon the knowledge of spatial sensitivity profiles of said transmit coils.

12. A device configured for magnetic resonance imaging of an object placed in a stationary and substantially homogeneous main magnetic field, comprising a main magnetic coil establishing said main magnetic field, gradient coils generating magnetic field gradients superimposed upon the main magnetic field, at least one RF transmit and/or receive coil radiating RF pulses towards the object and/or receiving magnetic resonance signals generated by sequences of RF pulses and switched magnetic field gradients, a control unit controlling the generation of magnetic field gradients and RF pulses in order to apply a prescan sequence in which interleaved RF pulses with at least two different excitation flip angles are applied and subsequently the control unit applies a separate and independent diagnostic scan sequence, and a processing unit programmed to:
   (a) process magnetic resonance signals acquired during the prescan sequence into at least two different prescan images;
   (b) compute spatial sensitivity profiles of the pixels or voxels from the prescan images and the at least two different excitation flip angles by using a dependence of values of the pixels or voxels on their respective excitation flip angle(s);
   (c) subsequent to steps (a) and ('b), process magnetic resonance signals acquired during the diagnostic scan sequence using the computed spatial sensitivity profiles into a diagnostic image.

13. A method of diagnostic imaging using a magnetic resonance imaging apparatus including at least three RF transmit and/or receive coils in an examination volume, the method comprising:
   (a) applying a prescan sequence which includes:
   (a1) exciting magnetic resonance within the examination region by applying RF pulses with each of at least three different excitation flip angles and a plurality of switched magnetic field gradients;
   (a2) acquiring magnetic resonance signals corresponding to each of the at least three different excitation flip angles from the examination region;
   (a3) processing the acquired magnetic resonance signals corresponding to each of the at least three different excitation flip angles in order to form a corresponding prescan magnetic resonance image for each of a plurality of combinations of the at least three RF transmit and/or receive coils wherein the number of prescan magnetic resonance images is at least three and there is at least one prescan magnetic resonance image for each of the at least three different excitation flip angles;

(a4) computing with a processor spatial sensitivity profiles of the pixels or voxels from the prescan images and the at least three different excitation flip angles by using a dependence of values of the pixels or voxels on their respective excitation flip angle(s) from the at least three prescan magnetic resonance images;

(b) performing a separate diagnostic MRI scan sequence in order to generate and acquire a plurality of diagnostic magnetic resonance signals subsequent to the prescan sequence defined by step (a);

(c) processing the acquired diagnostic resonance signals using the computed sensitivity profiles of step (a4) in order to generate a magnetic resonance diagnostic image.

14. The method according to claim 13, wherein computing the sensitivity profiles includes taking a logarithm of corresponding pixel or voxel values in each of the at least three prescan magnetic resonance images and solving a linear system of equations for each corresponding pixel or voxel.

15. The method according to claim 13, wherein the at least three prescan magnetic resonance images are lower in resolution than the diagnostic magnetic resonance image.

16. The method according to claim 13, wherein the prescan RF pulses for each of the at least three different excitation flip angles are applied in an interleaved manner.

17. A computer processor or computer-readable medium programmed with program code to control a magnetic resonance imaging device to perform the method of claim 13.

* * * * *